United States Patent
Patland et al.

(10) Patent No.: US 7,550,967 B1
(45) Date of Patent: Jun. 23, 2009

(54) CLOSED LOOP MAGNET CONTROL FOR MAGNETIC RECORDING HEAD TESTING APPARATUS

(75) Inventors: Henry Patland, Los Gatos, CA (US); Wade A. Ogle, San Jose, CA (US); Oleg Shurygin, Cupertino, CA (US); Ronald S. Selman, Santa Clara, CA (US)

(73) Assignee: Infinitum Solutions, Inc., Santa Clara, CA (US)

( * ) Notice: Subject to any disclaimer, the term of this patent is extended or adjusted under 35 U.S.C. 154(b) by 136 days.

(21) Appl. No.: 11/747,880

(22) Filed: May 11, 2007

(51) Int. Cl.
*G01R 33/12* (2006.01)
(52) U.S. Cl. .................................................. 324/210
(58) Field of Classification Search .................. 324/202, 324/210, 212, 225, 228, 262; 335/209
See application file for complete search history.

(56) References Cited

U.S. PATENT DOCUMENTS

| | | | |
|---|---|---|---|
| 4,514,687 A * | 4/1985 | Van Husen | 324/537 |
| 5,517,111 A | 5/1996 | Shelor | |
| 5,668,470 A | 9/1997 | Shelor | |
| 5,696,445 A * | 12/1997 | Inbar | 324/228 |
| 6,943,545 B2 | 9/2005 | Patland et al. | |
| 7,187,166 B2 * | 3/2007 | Sugano | 324/234 |

* cited by examiner

*Primary Examiner*—Kenneth J Whittington
(74) *Attorney, Agent, or Firm*—Silicon Valley Patent Group LLP

(57) ABSTRACT

A magnetic recording head tester uses closed loop control to accurately control the magnetic field that is generated to test the magnetic recording head. The closed loop control compares the value of the sensed magnetic field to the desired value of the magnetic field and adjusts the magnetic field accordingly. A magnetic field sensor used in the tester may be located in a position that has a substantially different magnetic field magnitude than is experienced by the magnetic recording head. The value of the output signal from the magnetic field sensor is correlated to the magnitude of the magnetic field at the location of the magnetic recording head through calibration. The correlation can then be used to accurately produce the desired magnitude magnetic field at the location of the magnetic recording head.

30 Claims, 6 Drawing Sheets

CLOSED LOOP MAGNET CONTROL FOR MAGNETIC RECORDING HEAD TESTING APPARATUS

FIELD OF THE INVENTION

The present invention is related to the production and control of a magnetic field that may be used, e.g., to test magnetic recording heads.

BACKGROUND

Magnetic fields are often used in the production or testing of articles. For example, magneto-resistive and magneto-optic heads, which are used to read and write data on disk drives, are generally tested while placed in a magnetic field. It is important to test such heads to ensure that a defective head is not installed within a disk drive. Moreover, to increase throughput, it is desirable to test for defective heads early in the production cycle. Improvements to testers that use magnetic fields are desired.

SUMMARY

A magnetic recording head tester, in accordance with one embodiment, uses closed loop control to accurately control the magnetic field that is generated to test the head. The closed loop control compares the value of the sensed magnetic field to the desired value of the magnetic field and adjusts the magnetic field accordingly. In another embodiment, a magnetic field sensor used in the tester may be located in a position that has a substantially different magnetic field magnitude than is experienced by the head. The value of the output signal from the magnetic field sensor is correlated to the magnitude of the magnetic field at the location of the head through calibration. The correlation can then be used to accurately produce the desired magnitude magnetic field at the location of the head.

DETAILED DESCRIPTION

Figure 1:
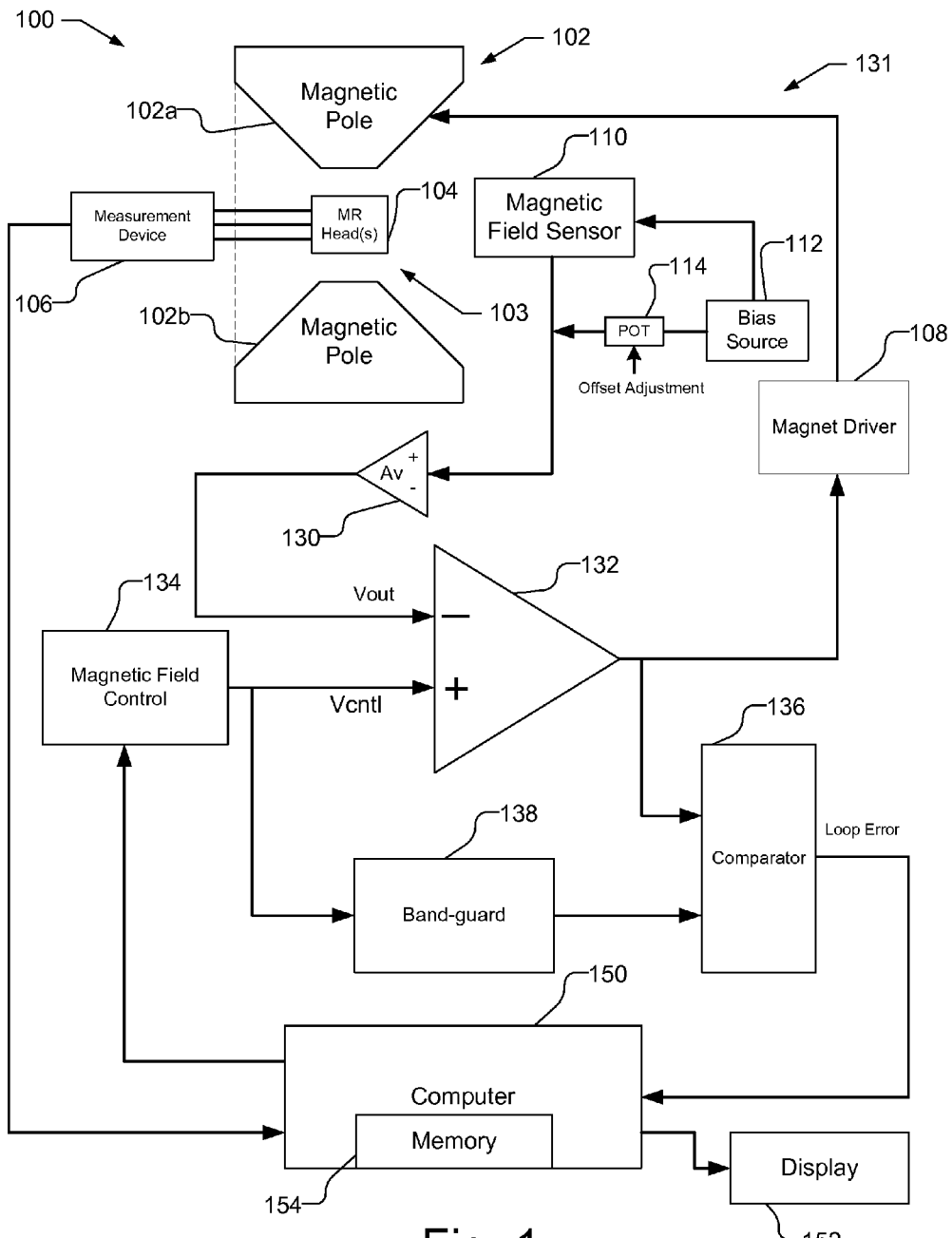
FIG. 1 is a schematic view of a magnetic recording head tester, in accordance with an embodiment of the present invention.
Figure 2A:
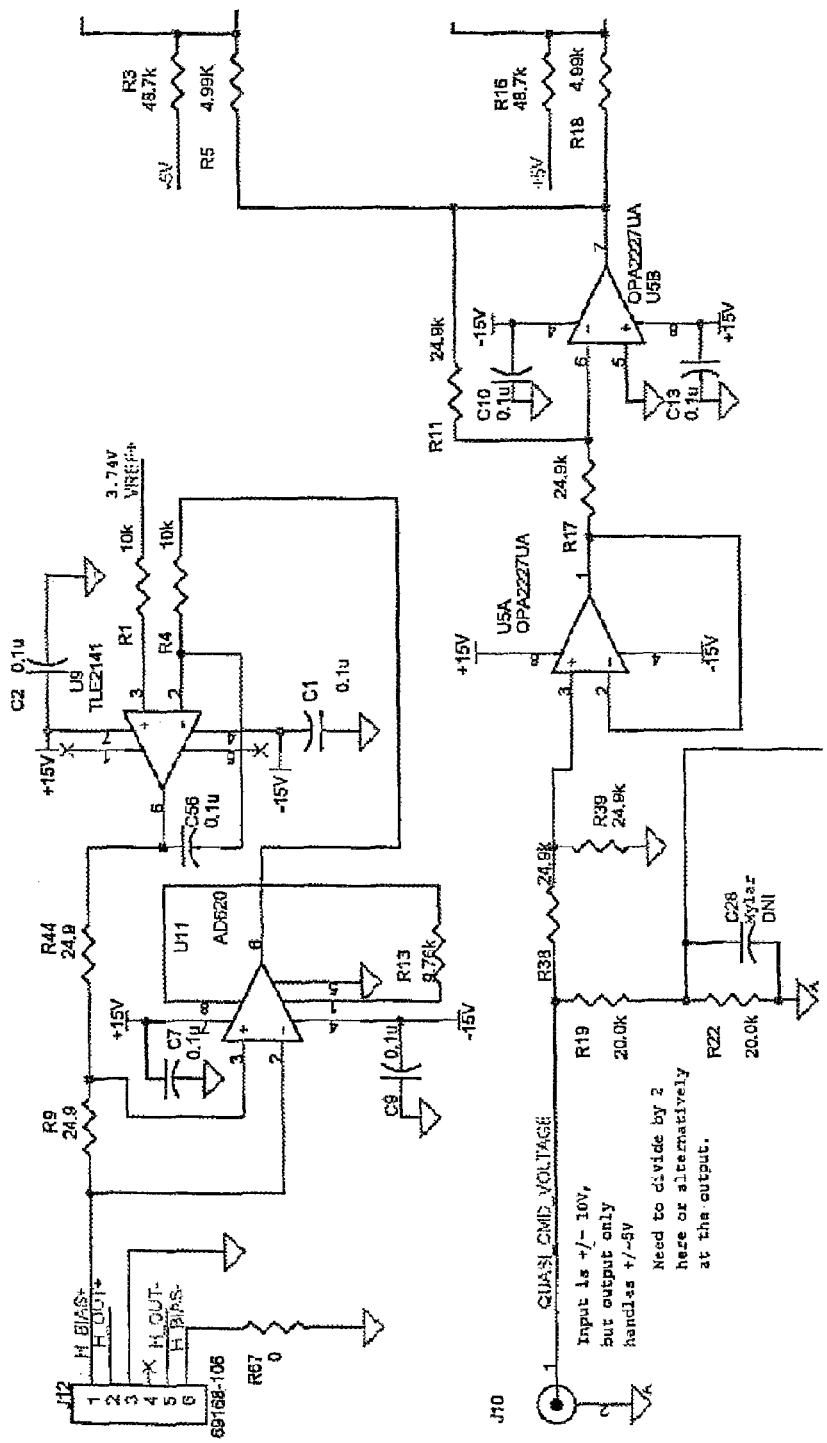
FIG. 2, containing FIGS. 2A, 2B, 2C, and 2D, collectively referred to hereinafter as FIG. 2, is a schematic diagram of a hardware-analog-adjusted closed-loop magnet control.
Figure 2B:
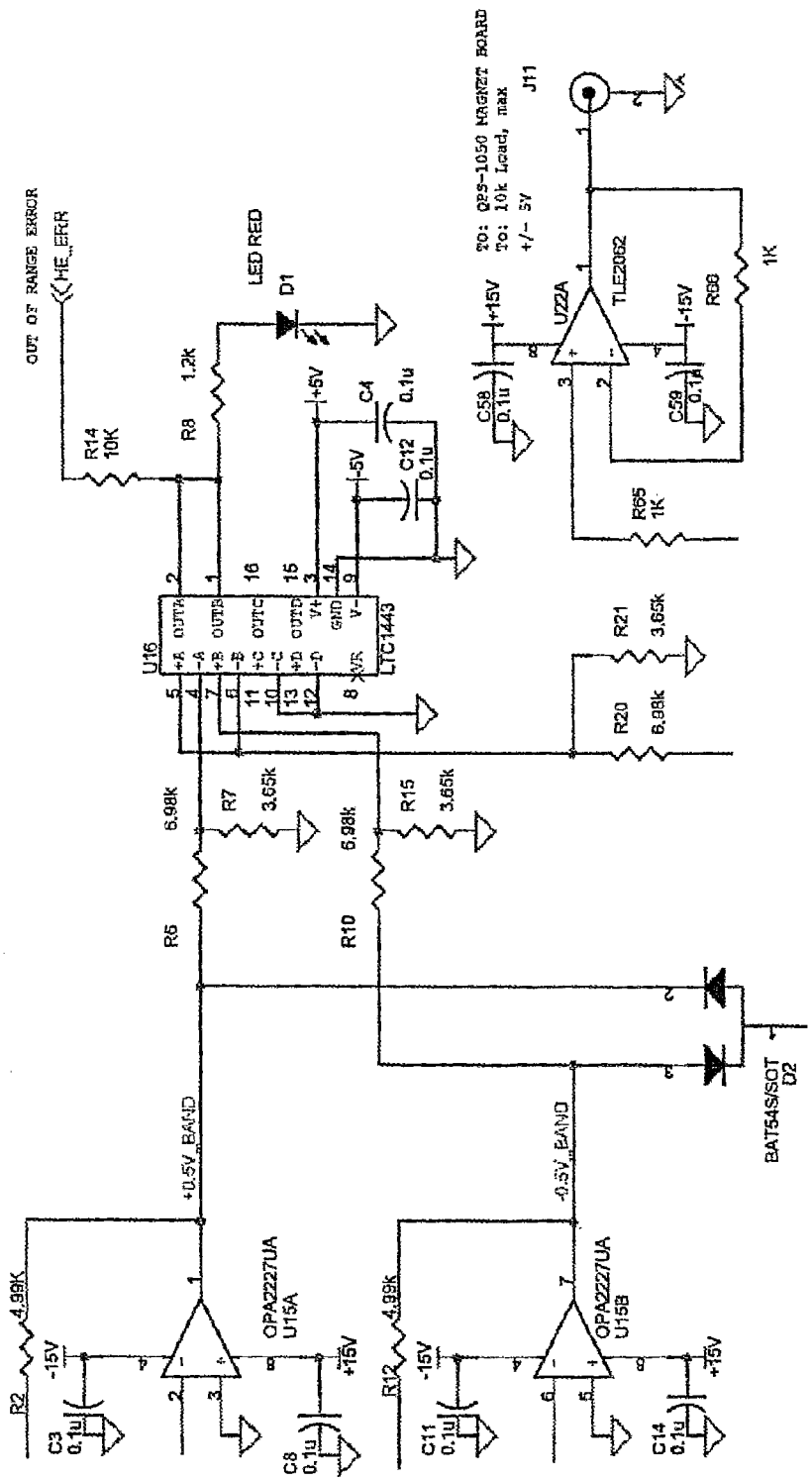
Figure 2C:
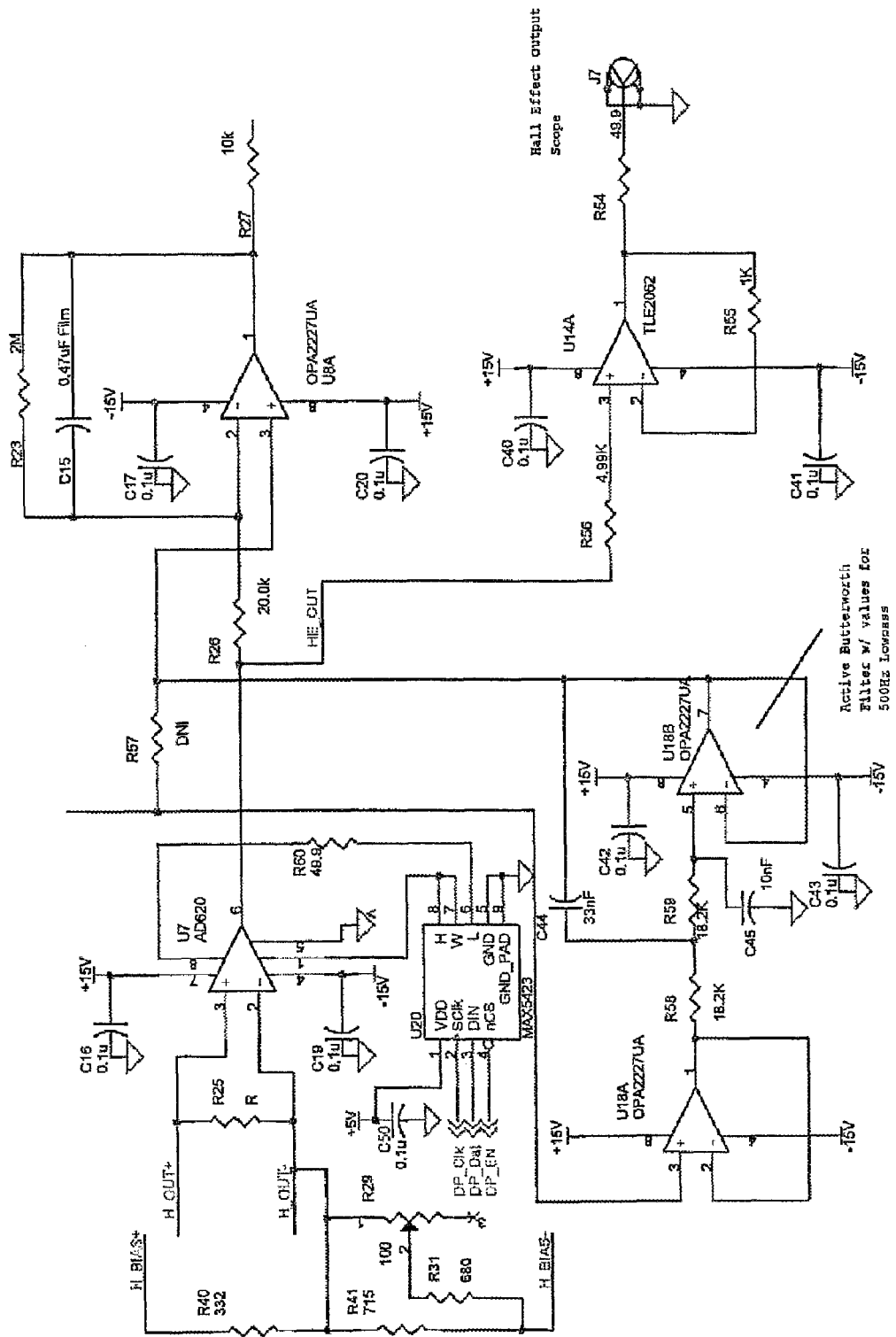
Figure 2D:
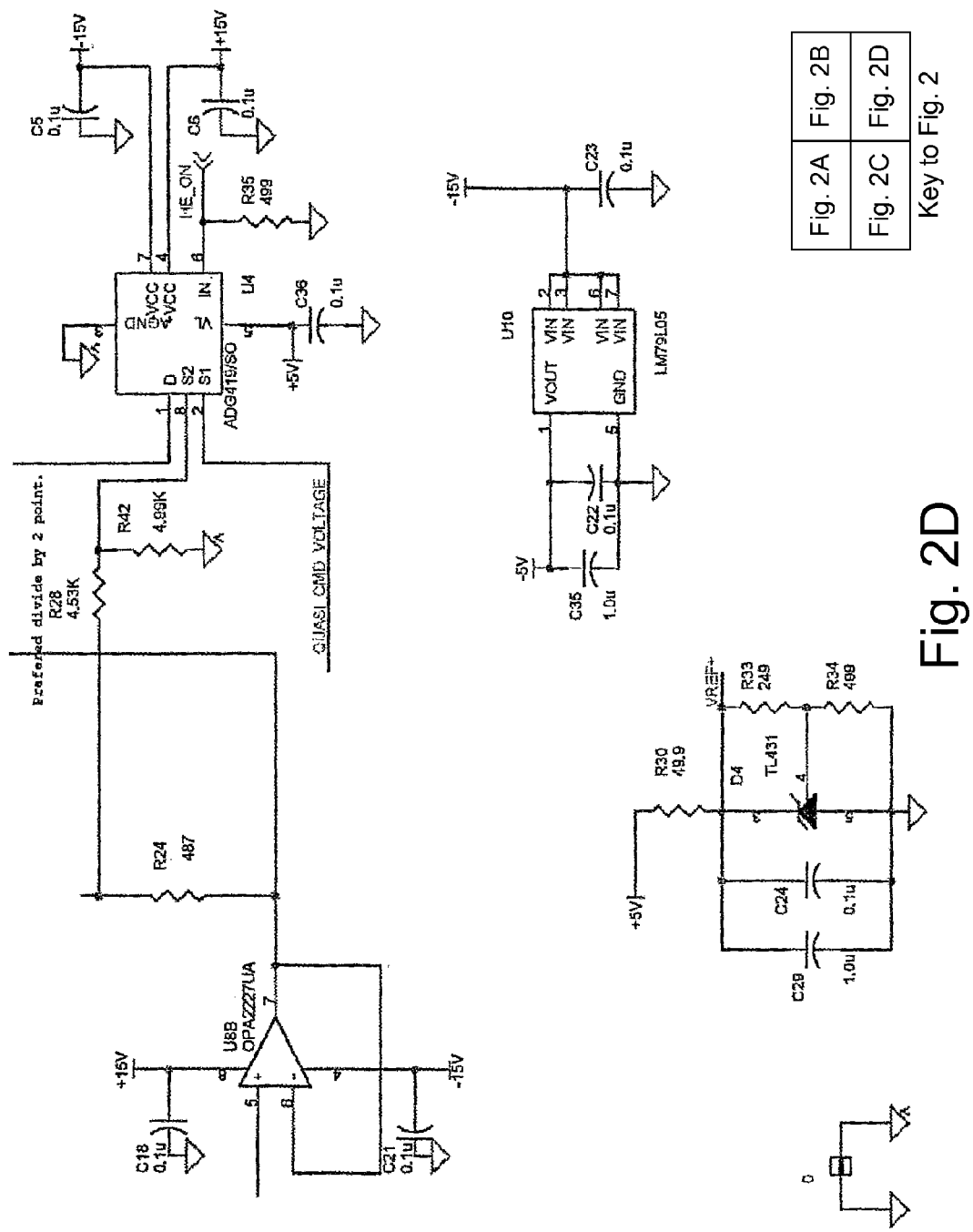

FIG. 1 is a schematic view of a magneto-resistive (MR) recording head tester 100 in accordance with an embodiment of the present invention. It should be understood that tester 100 may be used with magnetic recording heads other than MR heads, but for the sake of clarity only MR heads will be discussed herein. Tester 100 includes a magnetic field generation device 102, which may be an electromagnet with a high permeability magnetic core that includes a gap 103 between two poles 102a and 102b. Other magnetic field generation devices, such as a Helmholtz coil may be used if desired. The magnetic field generation device 102 is controlled with a magnet driver 108 that supplies a current to a coil in the magnetic field generation device 102. One or more MR head(s) 104 under test is positioned within the magnetic field produced by the magnetic field generation device 102, e.g., in one embodiment the MR head(s) 104 is located within the gap 103. In other embodiments, the MR head(s) 104 may be located outside of the gap 103. The MR head(s) 104 may be a single MR head or multiple MR heads, such as in a Head Stack Assembly (HSA) or a Head Drive Assembly (HDA). A measurement device 106 is coupled to the MR head(s) 104 to detect signals from the MR head(s) 104 while the MR head(s) 104 is excited by the magnetic field. The measurement device 106 may also be used to provide bias currents to the MR head(s) 104 during testing if desired. Any desired and/or well known type of testing may be performed on MR head(s) 104 with the MR head tester 100, for example, the test that is described, e.g., in U.S. Pat. No. 6,943,545, by Patland et al, entitled "Magnetic Head Tester", which is incorporated herein by reference.

A magnetic field sensor 110 is positioned so that it can detect the magnetic field produced by the magnetic field generation device 102. The magnetic field sensor 110 is, e.g., a Hall Effect sensor, but if desired other types of sensors may be used such as a second MR head. A bias source 112 is coupled to the magnetic field source 110 as is a potentiometer 114 that is used to adjust the DC offset of the magnetic field sensor 110 to compensate for any initial voltage produced by the magnetic field sensor 110 when no magnetic field is applied. The potentiometer 114 may be properly adjusted by applying zero magnetic field, e.g., by removing the magnetic field generation device 102 or placing the magnetic field sensor 110 in a zero-field chamber, biasing the magnetic field sensor 110 with bias source 112 and adjusting the potentiometer 114 to produce a 0V output. The zeroing adjustment of the magnetic field sensor 110 using the potentiometer 114 may be done manually or automatically through software control.

In one embodiment, the magnetic field sensor 110 is positioned in a location that is outside of the gap 103 of the magnetic field generation device 102, which is illustrated by broken lines that connect poles 102a and 102b. This is particularly advantageous, e.g., where the gap 103 in the magnetic field generation device 102 is small and can accommodate only one MR head, e.g., when large magnetic fields or high frequencies are desired. Positioning the magnetic field sensor 110 outside the gap 103 is also advantageous where the gap is crowded, when one or more MR heads with associated assembly equipment are positioned in the gap, e.g., such as with in-bar, HGAs, HSA, or HDA forms. Additionally, the gap may be crowded when additional equipment such as a thermal element is to be used to test the MR head at various temperatures. Moreover, the sample may be too large to fit in the gap 103, e.g., when testing a wafer or HDA, and may be placed in the fringe field. Accordingly, positioning the magnetic field sensor 110 outside the gap 103 may be advantageous. If desired, other locations for the magnetic field sensor 110 can be used.

The magnetic field produced by the magnetic field generation device 102 is controlled using a closed loop auto correction circuit, which includes, e.g., the magnetic field sensor 110, an operational amplifier 132, and magnet driver 108. The closed loop control of the magnetic field generation device 102 can also be performed using software if desired. FIG. 2 is a schematic diagram of a hardware-analog-adjusted closed-loop magnet control.

Referring to FIG. 1, in operation, a computer 150, which is used to control the tester 100, is coupled to a magnetic field control circuit 134. The computer 150 provides a signal to the magnetic field control circuit 134 indicating the desired magnitude of the magnetic field. The magnetic field control circuit 134 produces a control voltage Vcntl, e.g., 1V, to the operational amplifier 132 in a feedback loop circuit 131 that includes the operational amplifier 132, the magnet driver 108 and the magnetic field sensor 110. The operational amplifier 132 also receives the output signal Vout of the magnetic field sensor 110, which initially is, e.g., 0V. An amplifier 130 can be used to manually or automatically adjust the amplification of the output signal Vout from the magnetic field sensor 110 when a change in the system occurs, e.g., the magnetic field sensor 110 is replaced or relocated or the types of magnetic poles 102a/102b in the magnetic field generation device 102 are changed. For the sake of simplicity, the effects of amplifier will be ignored herein, unless specifically addressed.

The Vcntl and Vout voltages are respectively applied to the non-inverted and inverted inputs of the operational amplifier 132, which amplifies the difference between them to produce a signal that is applied to the magnet driver 108 input. In response, the magnet driver 108 provides the current to the coils in the magnetic field generation device 102 to produce a magnetic field. The magnetic field sensor 110 detects the magnetic field and accordingly generates a Vout signal this is fed back to the inverted input of the operational amplifier 132.

In case the magnetic field sensed by the magnetic field sensor 110 is higher or lower than the target value defined by Vcntl then the Vout signal will be greater or smaller than Vcntl. Because Vout is applied to the inverted input of the operational amplifier 132 a difference between Vcntl and Vout produces negative feedback for the operational amplifier 132 and the output signal causes the magnet driver 108 to adjust the current to the magnetic field generation device 102 until the Vout matches the reference voltage Vcntl. The remaining difference between Vcntl and Vout is proportional to the gain Av of the operational amplifier 132. For higher gain Av, in closed-loop equilibrium the remaining Vcntl-Vout difference will be smaller.

To achieve the targeted magnetic field value, Vout vs. the magnetic field characteristic of the magnetic field sensor 110 shall be matched with Vcntl vs. the target magnetic field characteristic. In practice, the offset from the magnetic field sensor 110 is removed, e.g., using potentiometer 114, and the gain of the output voltage Vout as defined by amplifier 130 is selected to match the Vcntl vs. target magnetic field characteristic.

As illustrated in FIG. 1, a band-guard circuit 138 and comparator 136 may be included in tester 100 to indicate if an error has occurred, e.g., if the output from the magnetic field sensor 110 deviates from the desired magnetic field control voltage Vcntl by some predetermined percentage or more, i.e., slightly greater than the worst-case signal provided by the operational amplifier 132. The band-guard circuit 138 receives the control voltage Vcntl and adds and subtracts a guardband voltage to it so that there are two signals, one that is an offset voltage (or some percentage) higher than the desired control voltage Vcntl and one that is lower than the desired control voltage Vcntl. The two voltages may be, but are not necessarily, symmetrically offset from the desired control voltage Vcntl. The comparator compares the differential signal from the operational amplifier 132 and the output signal(s) from the band-guard circuit 138. When the output signal(s) from the band-guard circuit 138 is greater (less) than the differential signal from the operational amplifier 132, a loop error signal is provided, e.g., to the computer 150, which can then stop the tester 100. It should be understood that other well known implementations of the guardband circuitry may be used, if desired.

Figure 3:
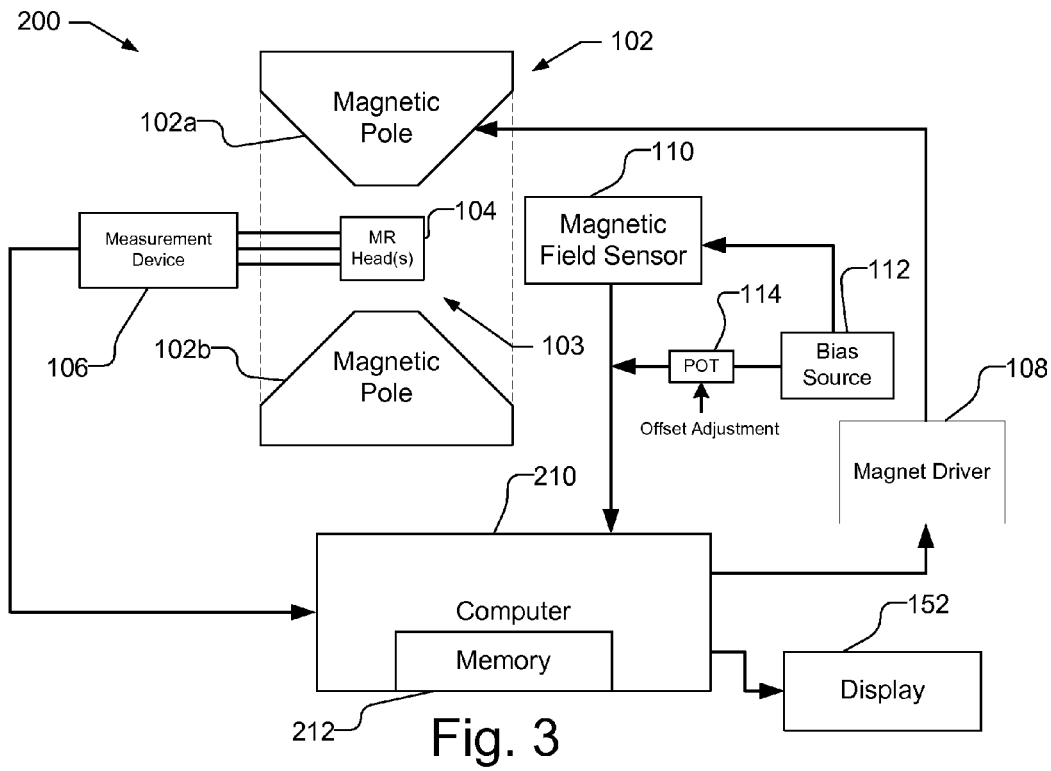
FIG. 3 illustrates a magnetic recording head tester similar to the tester shown in FIG. 1 that uses a computer to perform the closed-loop magnet control.

As discussed above, the closed-loop control of the magnetic field generation device 102 may also be performed in software. FIG. 3 illustrates a tester 200 similar to the tester 100 shown in FIG. 1, like designated elements being the same, except that tester 200 includes a computer 210 that implements computer instructions encoded in memory 212 to perform the closed-loop magnet control. In this embodiment, the magnetic field sensor 110 is coupled to the computer 210, e.g., through an A/D converter (not shown) and/or other appropriate interface, such as that produced by National Instruments Corporation of Austin, Tex., for example, model number NI USB-6229.

The computer 210 may program the magnetic field and provide an appropriate signal to the magnet driver 108 or alternatively, the magnetic field control circuit 134 shown in FIG. 1 may be used. The computer 210 receives the output signal from the magnetic field sensor 110, compares this with the desired signal, and reprograms the magnetic field. This is repeated until the desired magnetic field is produced. Generating computer instructions to perform these desired acts is well within the abilities of those skilled in the art in light of the present disclosure.

One of the advantages of closed-loop control of the magnetic field is that the generation of the magnetic field can be accurately controlled to produce the actual desired magnetic field to the MR head(s) 104 during test. Conventional systems, on the other hand, measure the magnetic field that is applied and correct for the difference between the desired magnetic field and the actual magnetic field after processing using software. Consequently, conventional systems typically do not test the performance of MR heads at the desired magnetic field, but instead test the MR head at a magnetic field that is close to the desired magnetic field and extrapolate the performance of the MR head at the desired magnetic field.

Figure 4:
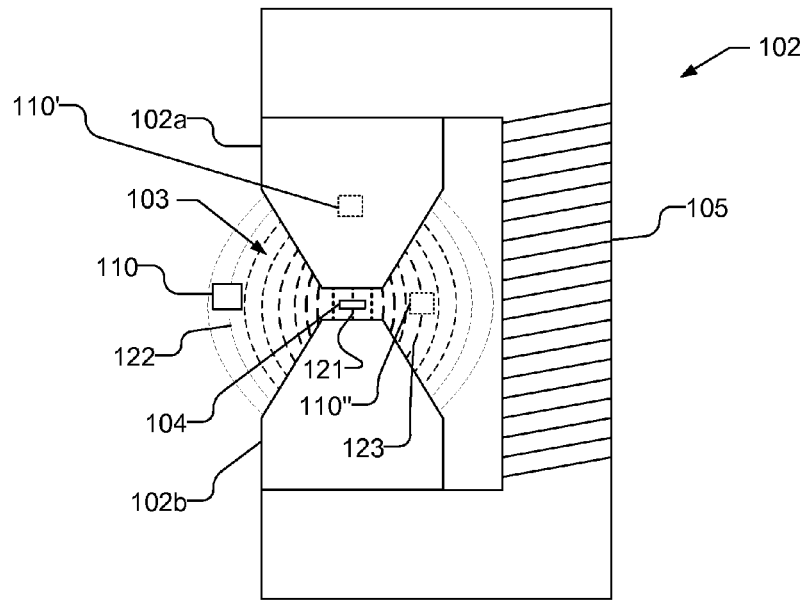
FIG. 4 is a side view of the poles of the magnetic field generation device and magnetic field lines along with placement of a magnetic recording head and magnetic field sensors.

As illustrated in FIG. 1, the magnetic field sensor 110 is positioned at a different location than the MR head(s) 104. FIG. 4 is a side view of the magnetic field generation device 102, illustrating the coil 105, poles 102a and 102b and the magnetic field lines. FIG. 4 also shows an MR head(s) 104 located in the gap 103, at the field line labeled 121, as well as several possible positions of the magnetic field sensor 110. For example, the magnetic field sensor 110 can be located outside of the gap 103, e.g., at the field line labeled 122. Alternatively, a magnetic field sensor 110' can be located inside one of the poles, e.g., pole 102a, which is also outside of the gap 103 as it is not between the poles 102a and 102b. No field lines are shown within the poles 102a and 102b for the sake of simplicity. Alternatively, in some embodiments, a magnetic field sensor 110" can be located between the poles 102a and 102b inside the gap 103, at the field line labeled 123. In another embodiment, the MR head(s) 104 may be located outside of the gap 103, but need not be located on the same field line, or an equipotential field line, as the magnetic field sensor 110.

Thus, the magnetic field sensor 110 senses a magnetic field that has a substantially different magnitude than what is experienced by the MR head(s) 104. By way of example, the magnetic field experienced by the MR head(s) 104, at field line 121, may have a magnitude of 100 Oe, while the magnetic field at the location of magnetic field sensor 110 outside the gap 103 at field line 122 may have a magnitude of only 80 Oe. The magnitude of the magnetic field at field line 123, i.e., the position of the magnetic field sensor 110", may be 90 Oe, while the magnitude of the magnetic field inside the pole 102a, i.e., the position of magnetic field sensor 110', may be greater than that experienced by the MR head, e.g., 110 Oe. Thus, the magnetic field sensor 110 senses a magnetic field at its location that has a magnitude that is substantially different, i.e., 2% or more, than the magnitude of the magnetic field experienced by the MR head(s) 104.

The output signal from the magnetic field sensor 110 is correlated to the value of the magnitude of the magnetic field at the MR head(s) 104 through calibration of the system. By way of example, the magnitude of the magnetic field at the position of the MR head(s) 104, i.e., at field line 121 in FIG. 2, is measured with a separate gaussmeter, while the output signal provided by the magnetic field sensor 110, e.g., at field line 122, is noted. Thus, for example, the magnetic field sensor 110 may produce an output signal of 1V when the separate gaussmeter indicates that the magnitude of the magnetic field at field line 121 is 90 Oe. Generally, the output signal of the magnetic field sensor 110 will linearly track the magnetic field, i.e., a magnetic field of 180 Oe at field line 121 will produce a 2V output signal from the magnetic field sensor 110. Accordingly, the correlation factor, which is the ratio of the output signal from the magnetic field sensor 110 to the magnitude of the magnetic field at the location of the MR head(s) 104 during test, can be generated through calibration and stored in memory 154 in computer 150 (or memory 212 in computer 210 in FIG. 3). Thus, in this example, if a magnetic field of 100 Oe is desired, computer 150 will apply the correlation factor of 1V/90 OE, and provide a signal to the magnetic field control circuit 134 to produce a voltage of 1.11V (100 Oe*1V/90 Oe).

It should be understood, that the computer 150 may implement this correlation factor in many different ways. For example, the correlation factor may be applied to each desired magnetic field to be used during the test of an MR head(s) 104. Alternatively, a table of magnetic field values and the associated output signal from the magnetic field sensor 110 may be generated, e.g., using the correlation factor or empirically. Such a table may be particularly useful when the magnetic field sensor 110 does not linearly track the magnetic field, such as when there is physical movement of the magnetic field sensor 110 during the application of varying magnetic fields. Calibration of the tester 100 at all the magnetic fields to be used during the test may be used to compensate for any non-linearities in the response of the magnetic field sensor 110.

Accordingly, when tester 100 generates a magnetic field, the magnitude of the magnetic field at the MR head(s) 104 is known based on the correlation factor between the output signal of the magnetic field sensor 110 and the magnitude of the magnetic field at the MR head(s) 104 and the closed loop control of the magnetic field. Thus, during a test, the magnitude of the magnetic field at the MR head(s) 104 is precisely known even though the magnetic field sensor 110 is not near the MR head(s) 104 and is not located at an equipotential field position with the MR head(s) 104.

With the magnitude of the magnetic field at the MR head known, the testing of the MR head may proceed in a conventional fashion, such as that described in U.S. Pat. No. 6,943,545. For example, the computer 150 may receive the output signal from the measurement device 106 during testing and determine the results of the test based on the signals from the measurement device 106 as well as with knowledge of the magnitude of the magnetic field. The results of the test may be displayed by display device 152, including, which may be, e.g., a printer or monitor. The computer 150 may also or alternatively store the results in memory 154. In one embodiment, the computer 150 may receive the sensed magnetic field signal from the magnetic field sensor 110, which can be used to indicate when to begin testing the MR head(s) 104, e.g., when the magnetic field is at the desired level. Alternatively, the computer 150 need not receive this signal, instead the tester 100 may wait until the auto correction of the magnetic field is complete before the measurement device takes the measurement (or multiple measurements) from the MR head(s) 104. This can be accomplished by waiting a set amount of time to ensure that the auto correction is complete. By way of example, the wait time may be based on the time necessary for correction at the maximum offset for which the magnetic field generation device 102 may have an error.

Thus, the tester 100 avoids limitations presented with conventional testers, such as that described in U.S. Pat. No. 5,517,111, in which great care must be taken to ensure that the MR head and the magnetic field sensor are positioned at 'equipotential' locations, i.e., locations with magnetic fields having the same magnitude. For example, one of the limitations of conventional testers, such as U.S. Pat. No. 5,517,111, is that when the MR head is placed in the gap, the magnetic field sensor must likewise be placed in the gap in order to sense the same magnitude magnetic field as experienced by the MR head. The gap, however, may be too small to accommodate both the MR head and the magnetic field sensor, particularly when more than one MR head is being tested, e.g., in a bar, wafer, HSA or HDA form. Moreover, using an 'equipotential' field location for sensing substantially the same field as applied to the MR head but at a different location, as discussed in U.S. Pat. No. 5,517,111, requires that a specific magnet design be used, which places design restrictions on the magnetic field generation system. For example, in tester 100, the tapered poles 102a and 102b may be switched with other types of poles, e.g., flat poles, with a relatively easy recalibration of the system, including adjustment of amplifier 130 and recalibration of the correlation factor. A conventional system, such as U.S. Pat. No. 5,517,111, on the other hand, would require the more difficult physical modification of the device to relocate the magnetic field sensor to a new location at which the magnitude of the magnetic field is the same as at the location of the MR head.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A tester for testing at least one magnetic recording head, comprising:
a magnetic field generation device having a coil;
a magnet driver circuit coupled to the coil of the magnetic field generation device, the magnet driver circuit providing a current to the coil, wherein the current creates a magnetic field that excites the at least one magnetic recording head during testing;
a magnetic field sensor positioned to sense the magnetic field and provide a signal indicating a value of the magnitude of the magnetic field, wherein the at least one magnetic recording head is located during testing at a position where the magnetic field has a first magnitude, and the magnetic field sensor is positioned where the magnetic field has a second magnitude that is substantially different than the first magnitude, wherein substantially different is a 2% or greater difference between the first magnitude and the second magnitude;

means for receiving the signal indicating the value and controlling the magnet driver circuit to adjust the current provided to the coil based on the signal indicating the value of the magnitude of the magnetic field until the value of the magnitude of the magnetic field is at a desired value; and a measurement circuit that measures an output signal created by the excited at least one magnetic recording head.

2. The tester of claim 1, wherein the means for receiving the signal indicating the value and controlling the magnet driver circuit comprises:

a comparison circuit having a first input terminal, a second input terminal and an output terminal, the first input terminal coupled to the magnetic field sensor and receiving the signal indicating the value of the magnitude of the magnetic field, the second input terminal coupled to receive the desired value, and the output terminal coupled to the magnet driver circuit, the comparison circuit comparing the signal indicating the value of the magnitude of the magnetic field and the desired value and producing on the output terminal a control signal to the magnet driver circuit to adjust the magnetic field to the desired value.

3. The tester of claim 2, wherein the comparison circuit is an operational amplifier.

4. The tester of claim 1, wherein the means for receiving the signal indicating the value and controlling the magnetic driver circuit comprises:

a computer coupled to the magnetic field sensor and coupled to the magnet driver circuit, the computer including a computer-usable medium having computer-readable program code embodied therein for causing the computer to compare the value of the magnitude of the magnetic field and the desired value and to produce a control signal to the magnet driver circuit to adjust the magnetic field to the desired value.

5. The tester of claim 1, wherein:

the magnetic field generation device has a gap and the magnetic field sensor is positioned outside of the gap during testing.

6. The tester of claim 5, wherein the at least one magnetic recording head is located within the gap during testing.

7. The tester of claim 1, the magnetic field sensor comprising:

a means for correlating the signal indicating the value of the second magnitude of the magnetic field at the position of the magnetic field sensor to the first magnitude of the magnetic field at the location of the at least one magnetic recording head.

8. The tester of claim 7, wherein the means for correlating the signal comprises a computer, the computer including a computer-usable medium having computer-readable program code embodied therein for causing the computer to generate a correlation factor between the first magnitude of the magnetic field at the location of the at least one magnetic recording head to a signal indicating the value of the second magnitude of the magnetic field at the location of the magnetic field sensor.

9. A tester for testing at least one magnetic recording head, comprising:

a magnetic field generation device that creates a magnetic field that excites the at least one magnetic recording head during testing;

a magnetic field sensor positioned to sense the magnetic field at a location at which the magnitude of the magnetic field is substantially different than the magnitude of the magnetic field at the location of the at least one magnetic recording head during testing, the magnetic field sensor provides an output signal indicating a value of the magnitude of the magnetic field at the magnetic field sensor;

means for correlating the output signal from the magnetic field sensor to the value of the magnitude of the magnetic field at the at least one magnetic recording head; and a measurement circuit that measures an output signal created by the excited at least one magnetic recording head.

10. The tester of claim 9, wherein substantially different is a 2% or greater difference between the magnitude of the magnetic field at the location of the magnetic field sensor and the magnitude of the magnetic field at the location of the at least one magnetic recording head.

11. The tester of claim 9, wherein the means for correlating the output signal from the magnetic field sensor comprises a computer, the computer including a computer-usable medium having computer-readable program code embodied therein for causing the computer to generate a correlation factor between the magnitude of the magnetic field at the location of the at least one magnetic recording head to an output signal from the magnetic field sensor.

12. The tester of claim 9, wherein the magnetic field generation device has a gap and the magnetic field sensor is outside of the gap during testing.

13. The tester of claim 12, wherein the at least one magnetic recording head is located within the gap during testing.

14. The tester of claim 9, wherein the magnetic field generation device includes a coil, the tester further comprising:

a magnet driver circuit coupled to the coil of the magnetic field generation device, the magnet driver circuit providing a current to the coil, wherein the current creates the magnetic field that excites the at least one magnetic recording head during testing; and means for controlling the magnet driver circuit to adjust the current provided to the coil based on the output signal of the magnetic field sensor until the value of the magnitude of the magnetic field is at a desired value.

15. The tester of claim 9, wherein the means for controlling the magnet driver circuit comprises:

a comparison circuit having a first input terminal, a second input terminal and an output terminal, the first input terminal coupled to the magnetic field sensor, the second input terminal coupled to receive a desired value of the magnitude of the magnetic field, and the output terminal coupled to the magnet driver circuit, the comparison circuit comparing the output signal indicating a value of the magnitude of the magnetic field at the magnetic field sensor to the desired value and producing on the output terminal a control signal to the magnet driver circuit to adjust the magnetic field to the desired value.

16. The tester of claim 15, wherein the comparison circuit is an operational amplifier.

17. The tester of claim 9, wherein the means for controlling the magnet driver circuit comprises:

a computer coupled magnetic field sensor and coupled to the magnet driver circuit, the computer including a computer-usable medium having computer-readable program code embodied therein for causing the computer to compare the output signal indicating a value of the magnitude of the magnetic field at the magnetic field sensor to the desired value and producing a signal to the magnet driver circuit a control signal to adjust the magnetic field to the desired value.

18. A tester for testing at least one magnetic recording head, comprising:

a magnetic field generation device, the at least one magnetic recording head is located during testing at a position where the magnetic field has a first magnitude;

a magnet driver circuit coupled to the magnetic field generation device, the magnet driver circuit providing a current to the magnetic field generation device, wherein the current creates a magnetic field that excites the at least one magnetic recording head during testing;

a magnetic field sensor is positioned with respect to the magnetic field generation device where the magnetic field has a second magnitude that is substantially different than the first magnitude, the magnetic field sensor provides a signal indicating a value of the second magnitude of the magnetic field;

a comparison circuit having a first input terminal, a second input terminal and an output terminal, the first input terminal coupled to the output terminal of the magnetic field sensor to receive the signal indicating the value of the second magnitude of the magnetic field, the second input terminal coupled to receive a desired value of a magnitude of the magnetic field, and the output terminal coupled to the magnet driver circuit, the comparison circuit comparing the value of the second magnitude of the magnetic field to the desired value and producing a signal indicating a differential signal on the output terminal; and a measurement circuit coupled to the at least one magnetic recording head, the measurement circuit measures an output signal created by the excited at least one magnetic recording head.

19. The tester of claim 18, wherein substantially different is a 2% or greater difference between the first magnitude and the second magnitude.

20. A method of testing at least one magnetic recording head, the method comprising:

generating a magnetic field;

controlling the magnitude of the magnetic field with a closed loop comprises:

sensing the magnitude of the magnetic field, wherein the magnitude of the magnetic field at the location of the at least one magnetic recording head is substantially different than the magnitude of the magnetic field that is sensed and substantially different is a 2% or greater difference between the magnitude of the magnetic field at the location of the at least one magnetic recording head and the magnitude of the magnetic field that is sensed;

adjusting the magnitude of the magnetic field based on the sensed magnitude of the magnetic field and a desired magnitude of the magnetic field;

using the magnetic field having the desired magnitude to excite the at least one magnetic recording head during testing;

measuring an output signal from the at least one magnetic recording head that is excited by the magnetic field having the desired magnitude;

correlating the sensed magnitude of the magnetic field to the magnitude of the magnetic field at the location of the at least one magnetic recording head; and reporting a result of the measured output signal from the at least one magnetic recording head to at least one of a display device and a computer memory that stores the reported result.

21. The method of claim 20, wherein generating a magnetic field comprises providing a current to a coil and wherein controlling the magnitude of the magnetic field with a closed loop further comprises:

comparing the sensed magnitude and the desired magnitude and adjusting the current provided to the coil based on the difference between the sensed magnitude and the desired magnitude.

22. The method of claim 20, wherein the magnitude of the magnetic field is sensed at a location outside of a gap in a magnetic field generation device that generates the magnetic field.

23. The method of claim 22, wherein the location of the at least one magnetic recording head is within the gap in the magnetic field generation device.

24. The method of claim 20, wherein substantially different is a 2% or greater difference between the magnitude of the magnetic field at the location of the at least one magnetic recording head and the magnitude of the magnetic field that is sensed.

25. The method of claim 20, wherein correlating the sensed magnitude of the magnetic field to the magnitude of the magnetic field at the location of the at least one magnetic recording head is performed prior to testing the at least one magnetic recording head and comprises:

generating a magnetic field;

sensing the magnitude of the magnetic field;

separately measuring the magnitude of a magnetic field at the location at which at least one magnetic recording head is held during testing;

producing the correlation between the sensed magnitude of the magnetic field and the separately measured magnitude of the magnetic field; and storing the correlation.

26. A method of testing at least one magnetic recording head, the method comprising:

generating a magnetic field to excite at least one magnetic recording head during testing;

sensing the magnitude of the magnetic field, wherein the magnitude of the magnetic field at the location of the at least one magnetic recording head is substantially different than a magnitude of the magnetic field that is sensed;

correlating the sensed magnitude of the magnetic field to the magnitude of the magnetic field at the location of the at least one magnetic recording head;

measuring an output signal from the at least one magnetic recording head that is excited by the magnetic field; and reporting a result of the measured output signal from the at least one magnetic recording head along with the magnitude of the magnetic field at the location of the at least one magnetic recording head during the test to at least one of a display device and a computer memory that stores the reported result.

27. The method of claim 26, wherein the magnitude of the magnetic field is sensed at a location outside of a gap in a magnetic field generation device that generates the magnetic field.

28. The method of claim 27, wherein the location of the at least one magnetic recording head is within the gap in the magnetic field generation device.

29. The method of claim 26, wherein correlating the sensed magnitude of the magnetic field to the magnitude of the magnetic field at the location of the at least one magnetic recording head is performed prior to testing the at least one magnetic recording head and comprises:

generating a magnetic field;

sensing the magnitude of the magnetic field;

separately measuring the magnitude of a magnetic field at the location at which the at least one magnetic recording head is held during testing;

producing the correlation between the sensed magnitude of the magnetic field and the separately measured magnitude of the magnetic field; and storing the correlation.

30. The tester of claim 26, wherein substantially different is a 2% or greater difference between the magnitude of the magnetic field at the location of the at least one magnetic recording head and the magnitude of the magnetic field that is sensed.

* * * * *